United States Patent [19]

Kaneko et al.

[11] Patent Number: 4,514,787
[45] Date of Patent: Apr. 30, 1985

[54] ELECTRONIC COMPONENT SERIES

[75] Inventors: Fumihiko Kaneko, Nagaokakyo; Tetsuya Murakawa; Koichi Nitta, both of Fukui; Noriaki Yamana, Takefu; Masashi Takeda; Kunio Tachi, both of Fukui, all of Japan

[73] Assignee: Murata Manufacturing Co., Ltd., Japan

[21] Appl. No.: 491,885

[22] Filed: May 5, 1983

[30] Foreign Application Priority Data

May 13, 1982 [JP] Japan ............................ 57-82098

[51] Int. Cl.³ .............................................. H05K 7/02
[52] U.S. Cl. ...................................... 361/420; 361/405; 206/330
[58] Field of Search ............... 361/331, 380, 397, 400, 361/404, 405, 417, 420, 419; 206/328, 330, 331

[56] References Cited

U.S. PATENT DOCUMENTS 3,162,721 12/1964 Rayburn ............................ 361/405
4,165,807 8/1979 Yagi .................................. 206/331
4,223,786 9/1980 Hori .................................. 206/330

FOREIGN PATENT DOCUMENTS 3107497 1/1983 Fed. Rep. of Germany ...... 206/330

OTHER PUBLICATIONS

Sprague Engineering Bulletin 3545A, Dip Solid-Electrolyte Capacitors, Type 196 D, North Adams, Mass, 1974.

Primary Examiner—G. P. Tolin
Attorney, Agent, or Firm—Ostrolenk, Faber, Gerb & Soffen

[57] ABSTRACT

An electronic component series wherein a plurality of parallel lead type electronic components (1) each having two parallel lead wires (4) are equispaced along a retainer band (2) and distributed along the length of the retainer band (2) with the lead wires (4) extending in the same direction and are positioned by the retainer band (2), whereby the electronic components (1) are retained. The electronic component series is characterized in that the distance (A) between the pair of lead wires (4) of each electronic component (1) in a region (4a) where the lead wires (4) are placed on the retainer band (2) is made different from that (B) in a region (4c) closer to the electronic component main body (3), while the intermediate portions (4b) of the lead wires (4) are bent to absorb the difference in dimension between the distances (A, B).

6 Claims, 5 Drawing Figures

ELECTRONIC COMPONENT SERIES

BACKGROUND OF THE INVENTION

1. Field of the Invention

This invention relates to an electronic component series and more particularly to improvements in setting the distance between the lead wires of each of a plurality of parallel lead type electronic components retained by a retainer band.

2. Description of the Prior Art

Electronic component series have been adopted into manufacturing process by many assembly makers in that automation can be advantageously realized by using an automatic machine which, while feeding the electronic component series by the retainer band and while separating the electronic components from the retainer band at a given station, feeds them to printed circuit boards.

Such electronic component series are usually produced by manufacturers of electronic components. The electronic component manufacturer has equipment for combining electronic components with a retainer band to provide an electronic component series, i.e., for taping electronic components. Such production equipment for electronic component series, in the case of handling parallel lead type electronic components, is designed to perform taping operation in accordance with the distance between the lead wires of each electronic component. Therefore, if the distance between the lead wires of each electronic component is changed, it becomes necessary to introduce new production equipment for such another electronic component series corresponding to the change.

An electronic component series takes a form, e.g., shown in FIG. 1, wherein a plurality of parallel lead type electronic components 1 are equispaced along a retainer band 2. Each electronic component 1 has an electronic component main body 3 and two lead wires 4 parallelly extending from said electronic component main body 3. The retainer tape 2 comprises, e.g., a retainer tape 5 and an adhesive tape 6 bonded to said retainer tape 5. The lead wires 4 of the electronic components are distributed in the direction of the length of the retainer band 2 so that they extend in the same direction, i.e., a direction at right angles with the direction of the length of the retainer band 2, and the adhesive tape 6 is bonded to the retainer tape 5 with the lead wires held therebetween, whereby they are positioned. With the lead wires 4 thus positioned relative to the retainer band 2, the electronic components 1 are retained by the retainer band 2. The retainer band 2 is provided with equispaced feed holes 7 for feeding the electronic component series in an automatic machine and positioning it at a predetermined position.

FIG. 1 shows an electronic component series having parallel lead type electronic components 1 with a lead wire distance F of 5.0 mm. Conventionally, the most common taping standardized lead wire distance has mostly been F=5.0 mm, and the electronic component series production equipment has been designed accordingly. However, where a demand arises in the market for a high-density package, an electronic component 1 with, e.g., F=2.5 mm, as shown in FIG. 2, becomes necessary. In this case, it becomes necessary for the electronic component manufacturer to newly introduce electronic component series production equipment corresponding thereto.

However, it is not likely that the market demand is limited to this. It should be naturally expected that a variety of dimensions for F will be required. Introduction of new production equipment each time such a demand arises would not pay and would be inefficient, and an effective means to overcome this problem is desired. Further, the equipment for retaining electronic components on a retainer band must satisfy growing needs for increasing the operating speed and the accuracy of lead wire distance, but the smaller the F, the more problems arise from the technical point of view. Thus, the efficiency of operation has heretofore been greatly decreased.

SUMMARY OF THE INVENTION

Accordingly, a principal object of the invention is to provide an electronic component series which can be economically and efficiently produced by the existing production equipment to satisfy needs for different lead wire distances while maintaining the taping standard unchanged.

In brief, according to the invention, with attention paid to the fact that the function of the lead wires of each electronic component differs from region to region thereof, the lead wire distance in a region thereof directly associated with the retainer band where the lead wired are retained by the retainer band is given a dimension based on a representative given standard selected according to the production equipment, whereas the lead wire distance in a region where the lead wires are inserted into holes in a printed circuit board is determined on the basis of the distance between the holes of the printed circuit board, while the difference in the distances of lead wires is absorbed by bending the lead wires at the boundary of the two regions.

According to this invention, it is possible to meet varying market demands in connection with the region where the lead wires are inserted into holes in a printed circuit board while maintaining the lead wire distance in a region where the lead wires are retained by the retainer band at a constant value on the basis of a given standard, thereby enabling the electronic component manufacturer to produce electronic component series under advantageous conditions. The deformation of lead wires required in this invention can be attained simply by partly changing the tools in the lead shaping stage. Further, for those who actually use electronic component series such as assembly makers, it is possible to take out electronic components having a desired lead wire distance by cutting the lead wires by an automatic machine, so that there will be no trouble in automatic insertion into printed circuit boards. It is expected that parallel lead wire type electronic parts having narrower lead wire distances will be required in response to the growing tendency for the package density to increase. This invention works as an effective means to satisfy such requirement.

These objects and other objects, features, aspects and advantages of the present invention will become more apparent from the following detailed description of the present invention when taken in conjunction with the accompanying drawings.

3

DESCRIPTION OF THE PREFERRED EMBODIMENTS

Figure 2:
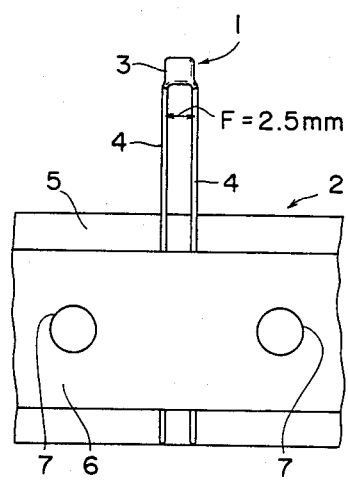
FIG. 2 is a plan view of part of an electronic component series having parallel lead type electronic components whose lead wire distance F is 2.5 mm.
Figure 3:
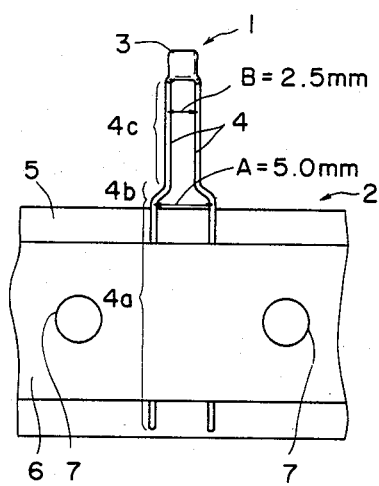
FIG. 3 is a plan view of part of an electronic component series according to an embodiment of this invention.
Figure 4:
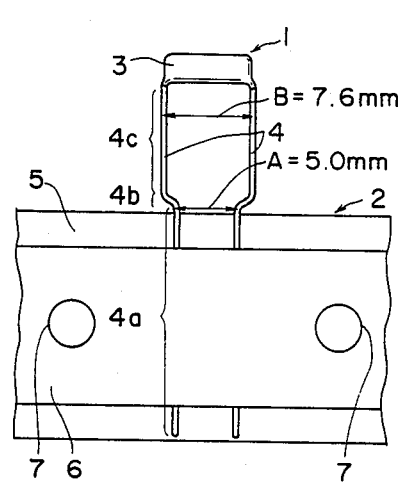
FIG. 4 is a plan view of part of an electronic component series according to another embodiment of the invention.

FIGS. 3 and 4 are plan view each partly showing a typical form of electronic component series according to embodiments of the invention. In addition, it should be noted that FIGS. 1 through 4 and FIG. 5 to be later described are drawn on the same scale. In proceeding with the description, it is to be understood that the value "5.0 mm" which is the lead wire distance F shown in FIG. 1 is a lead wire distance conforming to the taping standard.

Figure 1:
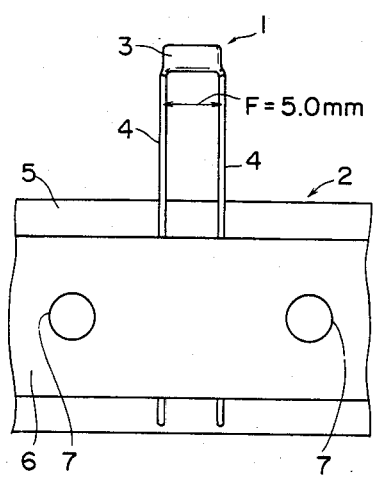
FIG. 1 is a plan view of part of an electronic component series having parallel lead type electronic components whose lead wire distance F is 5.0 mm.

FIG. 3 shows an electronic component 1 intended to satisfy both the requirement directed to the printed circuit board, which is satisfied by the electronic component 2 of FIG. 2, and the requirement for the taping standard satisfied by the electronic component 1 of FIG. 1. Each lead wire 4 is divided into a first region 4a, a second region 4b and a third region 4c successively from the front end to the root, and their respective features will be described. These regions 4a, 4b and 4c have mutually different functions. The first region 4a performs the function of retaining the electronic component 2 in the retainer band 2 by being positioned along and on the retainer band 2. The distance A between the two lead wires 4 in the first region 4a is, e.g., 5.0 mm, which is equal to said standardized lead wire distance F of 5.0 mm in FIG. 1. The third region 4c performs the function of attaching the electronic component 1 to the printed circuit board by being inserted into holes in the printed circuit board. The distance B between the two lead wires 4 in the third region 4c is given a dimension corresponding to the distance between the holes of the printed circuit board; in this embodiment B=2.5 mm. The second region 4b interposed between the first and third regions 4a and 4c performs the function of absorbing the difference in dimension between the distances A and B in the first and third regions 4a and 4c. In this embodiment, in the second region 4b, the lead wires 4 are outwardly bent to absorb the difference in dimension produced by the distance A exceeding the distance B.

Also in the embodiment shown in FIG. 4, each lead wire 4 is divided into a first through a third regions, 4a–4c. In the case of the electronic component 1 shown in FIG. 4, the distance B of the lead wires 4 in the third region 4c is greater than that of FIG. 1. Thus, this distance B is 7.6 mm. In spite of this, the distance A of the lead wires 4 in the first region 4a is constant, or 5.0 mm. In this case, in the second region 4b, the lead wires are inwardly bent to absorb the difference in dimension between the distances A and B.

The embodiments described above are examples only, and various changes are possible as to the dimension.

Further, the electronic component main body 3 has been square in shape in each illustrated example, but the invention is not limited to this shape and circular and other shapes may be used.

Figure 5:
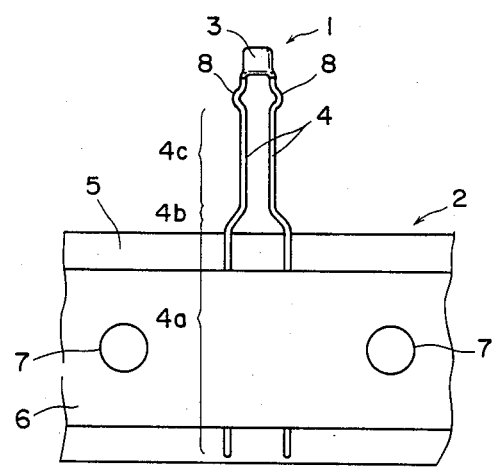
FIG. 5 is a plan view of part of an electronic component series according to a further embodiment of the invention.

FIG. 5 shows the positioning of the first, second and third regions 4a, 4b and 4c on the lead wires 4 where each lead wire 4 is formed with a crimp 8 that constitutes a positioning formation. Particularly, this example is for the purpose of clarifying the significance of the third region 4c. The third region 4c has the function of attaching the electronic component 1 to the printed circuit board by being inserted into holes in the printed circuit board. The crimps 8 shown in FIG. 5 determine the end of insertion of the lead wires into holes in the printed circuit board, and the crimps 8 and the portions thereabove have nothing to do with the holes of the printed circuit board. Therefore, the third region 4c is a region positioned below the crimps 8 and including the ends of the lead wires 4 to be cut when inserted into the holes of the printed circuit board.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electronic component series wherein a plurality of parallel lead type electronic components each having a body with first and second lead wires extending forward therefrom and being equispaced along a retainer band and distributed along the length of the retainer band with the lead wires extending in the same direction and positioned by the retainer band, whereby the electronic components are retained, said electronic component series being characterized in that said lead wires being divided into a first region, a second region rearward of said first region and a third region rearward of said second region, said regions having mutually different functions, said first region performing the function of retaining the electronic component with respect to the retainer band by being positioned along and on the retainer band, in said first region the lead wires of each electronic component being spaced apart by a first distance equal to a constant dimension serving as a standard, said third region performing the function of attaching the electronic component to a printed circuit board by being inserted into holes in the printed circuit board, in said third region said leads being spaced apart by a second distance having a dimension conforming to the distance between the holes of the printed circuit board, said first and second distances being unequal resulting in a difference in dimension therebetween, said second region performing the function of absorbing the difference in dimension between said first and second distances, said retainer band having a rear edge, said second and third regions being disposed to the rear of said rear edge, said third region being substantially greater than said second region when measured in a direction perpendicular to said rear edge.

2. An electronic component series as set forth in claim 1, wherein the first distance is greater than the second distance, and the lead wires are bent in the second region outwardly toward the first region.

3. An electronic component series as set forth in claim 1, wherein the first distance is smaller than the second distance, and the lead wires are bent in the second region inwardly toward the first region.

4. An electronic component series as set forth in claim 1 in which the front of the third region extends relatively close to the rear edge of the retainer band.

5. An electronic component series as set forth in claim 4 wherein at said third region each of said leads having a transverse positioning formation to limit insertion of said leads into holes in a printed circuit board.

6. An electronic component series as set forth in claim 5 in which each of said formations is positioned substantially closer to the body of the component than to the second region.

* * * * *